United States Patent [19]

Bruton

[11] Patent Number: 5,198,779

[45] Date of Patent: Mar. 30, 1993

[54] DIGITAL OSCILLATOR

[75] Inventor: Leonard T. Bruton, Alberta, Canada

[73] Assignee: NovAtel Communications Ltd., Calgery, Canada

[21] Appl. No.: 876,004

[22] Filed: Apr. 29, 1992

[51] Int. Cl.$^5$ ............................................ G06F 15/34
[52] U.S. Cl. ............................................ 328/14; 328/27; 328/55; 328/160; 328/60; 331/60; 307/512
[58] Field of Search ............... 328/14, 27, 60, 62, 328/55, 160; 331/60, 61; 307/512

[56] References Cited

U.S. PATENT DOCUMENTS

| | | | |
|---|---|---|---|
| 3,582,625 | 6/1971 | Rouxel | 328/27 |
| 3,649,821 | 3/1972 | Gumacos | 328/14 |
| 4,159,526 | 6/1979 | Mosley, Jr. et al. | 328/14 |
| 4,285,044 | 8/1981 | Thomas et al. | 328/14 |

Primary Examiner—William L. Sikes
Assistant Examiner—Scott A. Ouellette
Attorney, Agent, or Firm—Cesari and McKenna

[57] ABSTRACT

A digital oscillator generates pairs of sampled sinusoidal signals having precisely established phase relationships, e.g., in near-perfect quadrature. The digital oscillator has first and second, interconnected multiplying-integrating modules. Each module has a multiplier for multiplying an input signal by a first coefficient, and a digital integrator for integrating the product over a period of time and thereby generating a different one of the sampled sinusoidal signals. Setting the multiplier coefficients appropriately controls the amplitudes of the generated sinusoidal signals. Likewise, the frequencies and phases of the sinusoidal signals are controlled in response to the values of the multiplier coefficients and to the period of integration. In a preferred embodiment, the first module has a delay-free-forward-path ("DFEP") integrator, and the second module uses a delay-forward-path ("DFP") integrator. In the DFFP integrator, the forward path from input to output within the integrator is substantially delay-free, and a device provides a delay in a feedback path between the integrator input and output. In a DFP integrator, on the other hand, a device provides a delay in the forward path, and the feedback path is substantially delay-free. Other versions of the invention provide two pairs of quadrature-related sampled sinusoidal signals.

27 Claims, 5 Drawing Sheets

DIGITAL OSCILLATOR

FIELD OF THE INVENTION

The invention relates to oscillators, i.e., electronic devices used for generating sinusoidal signals. More particularly, the invention relates to digital oscillators capable of producing quadrature-related signals suitable for use in telecommunication applications, such as radio-telephone systems.

BACKGROUND OF THE INVENTION

Essentially, digital oscillators provide sequences of digitally-encoded values representing samples of continuous-time sinusoidal signals. The output sequences from digital oscillators can be called "sinusoidal digital sequences," "digitally-encoded sinusoidal signals," or "sampled sinusoidal signals" to distinguish them from analog or continuous-time sinusoidal signals produced, e.g., by analog oscillators.

Since the samples are typically taken at uniform intervals of time, the sampled sinusoidal signals from digital oscillators are characterized by sampling rates or frequencies ("$f_s$") in addition to being characterized by the frequencies ("$f_0$"), phases and amplitudes of the continuous sinusoids they specify.

With sufficient sample values for each cycle of the sinusoidal signal, i.e., with a sufficiently high ratio of $f_s$ to $f_0$, the sinusoidal digital sequence can represent accurately a sinusoidal signal having any desired frequency, amplitude, and phase.

Known digital oscillators can be characterized as either signal-store-type or signal-generator-type oscillators. A signal-store-type digital oscillator can be implemented, for example, as a read-only-memory ("ROM"), in which pre-calculated digital sequences specifying one or more sinusoidal signals are stored. The ROM is accessed typically with the aid of addressing logic. This approach has the advantage that the stored digital sequences are readily and dependably available, and need not be generated each time they are needed in an application, and thus are not subject to errors that could be introduced during repeated generation.

On the other hand, the drawbacks of this approach are readily apparent. For instance, the size of the memory limits the number of stored digital sequences (and thus the number of sample values per cycle), or the number of sinusoidal signals specified by the stored sequences, or both.

On the contrary, signal-generator-type digital oscillators overcome many of these drawbacks since they avoid the required storage of sample values of sinusoidal signals, though at the expense of requiring arithmetic operations for generating the values each time they are needed.

A known version of such an oscillator uses registers and adders in a closed loop arrangement. The output of a first adder is fed to a first register, where it is stored for a clock cycle. Thereupon, that register passes its contents to both a second register and a multiplier. The second register stores the signal from the first register for one clock cycle, and then passes it to the adder as a first input. The multiplier forms the product of the signal from the first register and a coefficient "m" and provides the product to the adder as a second input. The adder forms the sum of the signal from the second register and the product from the multiplier, which sum is applied to the first register as described above. The second shift register also passes its contents onto an output line. The digital sequences on the output line are the samples of a sinusoidal signal of selected amplitude, phase and frequency.

While such signal-generator-type digital oscillators are generally adequate for many applications, they generally require relatively expensive, high-precision multipliers when sampling rates are high, e.g., above about 50 samples per cycle. On the other hand, when sample rates are low, e.g., below 20 samples per cycle, expensive low-pass filters typically are employed to smooth the resulting sinusoidal signals following conversion of the digital sequences from the oscillators to analog signals.

Also, such digital oscillators are designed to generate only a single sinusoidal sequence at a time. Accordingly, such digital oscillators are incapable of meeting the needs of certain telecommunication applications that require, e.g., concurrently-supplied plural sinusoidal signals of different (or even varying) amplitudes, phases or frequencies.

Consider an illustrative application that requires quadrature-related signals. Radio-telephone transmitters employing quadrature modulation, and receivers employing quadrature demodulation, each require simultaneously two sinusoidal signals that are exactly 90 degrees apart in phase, i.e., signals that are in perfect quadrature. Typically, in such an arrangement, the transmitter phase-modulates each of the quadrature-related signals with the information (e.g., voice) to be transmitted, and then combines the modulated signals for broadcast. Analogously, the receiver multiplies the received signals with quadrature-related signals to obtain separate "in-phase" and "quadrature" signals.

The accuracy of the recovery of the information can be affected detrimentally by any significant variation from perfect quadrature in the pairs of quadrature-related signals used in the transmitter and receiver.

Unfortunately, known signal-generator-type digital oscillators do not simultaneously supply perfectly quadrature signals for such applications in a reliable manner and without significant expense—both in terms of design and manufacturing costs and in terms of the number, size (i.e., real estate on an integrated chip) and power requirements of electronic components needed to implement such circuits.

Radio-telephones also use oscillator-supplied sinusoidal signals for other purposes, e.g., as system-test signals, and for supervisory-audio tones and dialing tones. Accordingly, radio-telephones require oscillators for producing a variety of different sinusoidal signals used for a variety of applications.

SUMMARY OF THE INVENTION

Briefly, the invention resides in a digital oscillator for digitally generating pairs of sampled sinusoidal signals having precisely established phase relationships, e.g., in near-perfect quadrature. The digital oscillator has first and second, interconnected multiplying-integrating modules. Each module has a multiplier for multiplying an input signal by a first coefficient, and a digital integrator for integrating the product over a period of time and thereby generating a different one of the sampled sinusoidal signals.

Typically, an application will call for sinusoidal signals having particular amplitudes, frequencies and phases. Setting the multiplier coefficients, along with the initial values in the registers of the integrators, controls the amplitudes of the generated sinusoidal signals. For sinusoidal signals of the same amplitude for example, the multiplier coefficients are made equal to one another. Likewise, the frequencies and phases of the sinusoidal signals are controlled in response to the values of the multiplier coefficients and to the period of integration established by a clock signal. Indeed, the frequencies of the sinusoidal signals for constant sampling frequencies, are proportional to the multiplier coefficients.

More specifically, in the preferred embodiment, the first module has a delay-free-forward-path ("DFFP") integrator, and the second module uses a delay-forward-path ("DFP") integrator. In the DFFP integrator, the forward path from input to output within the integrator is substantially delay-free, and a device such as, e.g., a shift register, provides a delay in a feedback path between the integrator input and output. In a DFP integrator, on the other hand, a device such as, e.g., a shift register, provides a delay in the forward path, and the feedback path is substantially delay-free.

The output of the integrator of each module is applied to the other module as the multiplier input signal. Thus, the multiplying-integrating modules are connected in a closed-loop, feedback arrangement.

The outputs of the delay-introducing devices are the desired digitally-sampled sinusoidal signals. As such, these outputs are brought out of the integrators via output lines, by means of which they can be applied to down-stream devices, e.g., for storage or processing. Analog signals can be obtained by feeding the digital sequences to digital-to-analog converters ("DAC's").

The digital sequences from the delay-introducing devices of the two modules accurately represent two digitally-sampled sinusoidal signals that are exactly "T/2" seconds from being in perfect quadrature, where "T" is the time in seconds of the delays introduced in the integrators by the delay devices, (i.e., the period of the clock used for timing the integrators), and is equal to the reciprocal of the sampling frequency, $f_s$.

Since the sampling frequency is typically higher, and preferably much higher, than the frequency of the generated sinusoidal signals, and the latter frequency is typically in the audio or even radio frequency range, T/2 is quite small, and the digital sequences represent sinusoidal signals that are nearly in quadrature.

Where perfectly-quadrature-related signals are desired, a suitable delay of T/2 can be introduced into the leading or advanced sinusoidal digital sequence, thereby eliminating the departure from perfect quadrature between the two signals. Alternatively, where the digital signals are converted by DAC's into analog signals, the delay can be introduced into the leading analog signal. Other versions of the invention provide digital representations of, e.g., two pairs of quadrature-related sinusoidal signals.

The digitally-encoded quadrature-related sinusoidal signals can have constant or varying amplitudes and frequencies controlled by the appropriately setting of the values of the multiplier coefficients and "T," as alluded to above. For instance, by varying the values of the multiplier coefficients in a controlled manner, the digital oscillator provided by the invention can serve as an amplitude, frequency or phase modulator.

In accordance with the invention, the multiplication operations in the digital oscillator can be performed, for example, by discrete, hardware multipliers. Alternatively, in a so-called "multiplier-less" version, the multiplication operations can be performed, e.g., by accumulators performing repeated additions.

The various versions of the invention can be implemented in a straight-forward manner in circuit form, or as a routine executable by a programmable digital signal processor ("DSP"). Advantageously, when implemented in circuit form, the invention overcomes the drawbacks attending the known digital oscillators described above. When implemented in a DSP, the digital oscillator can provide for the lossless generation of the sampled sinusoidal signals.

BRIEF DESCRIPTION OF THE DRAWINGS

The above and further advantages of the invention may be better understood by referring to the following description in conjunction with the accompanying drawings, in which.

DETAILED DESCRIPTION OF A PREFERRED EMBODIMENT

Figure 1A:
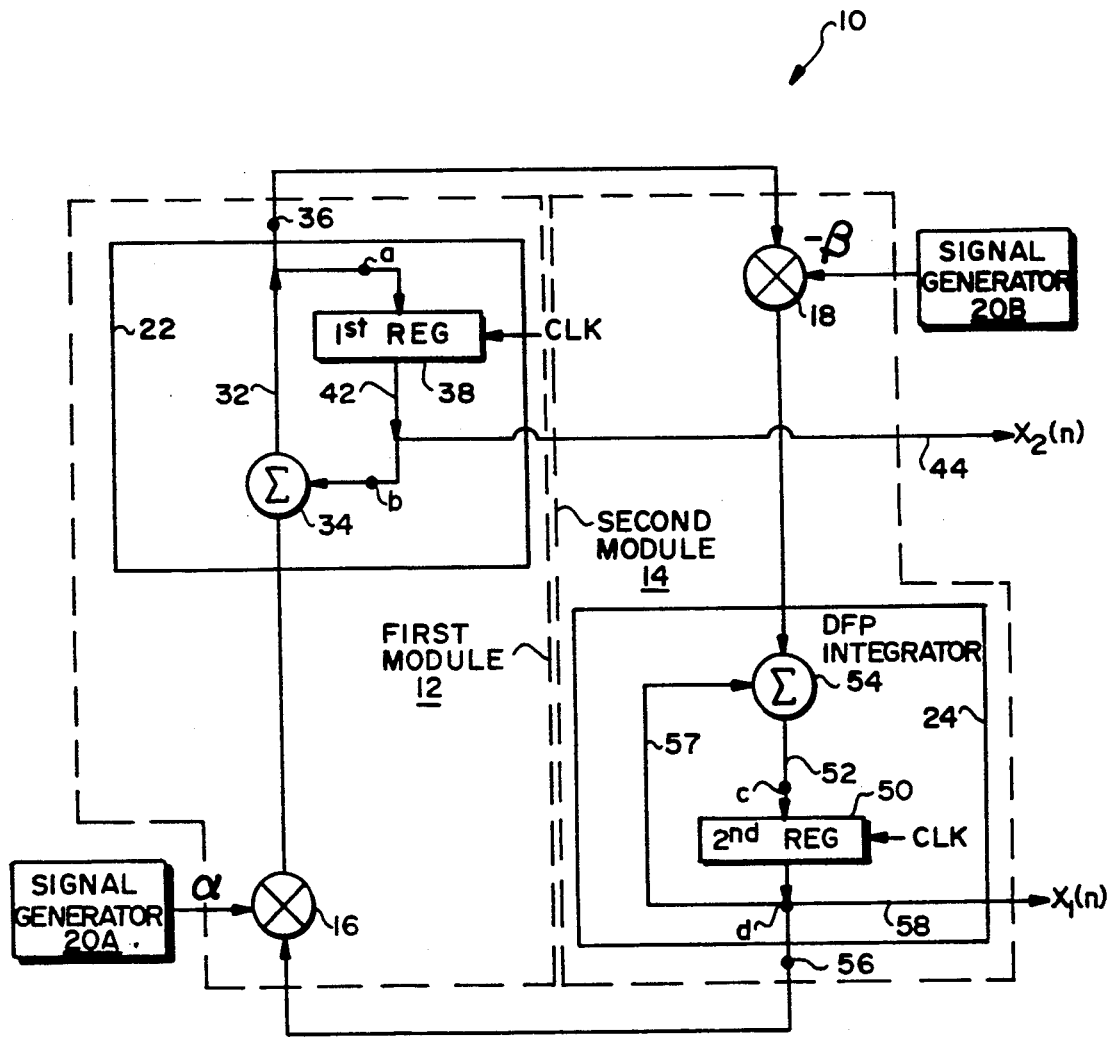
FIG. 1A is a block diagram of a digital oscillator in accordance with the present invention.
Figure 1A:
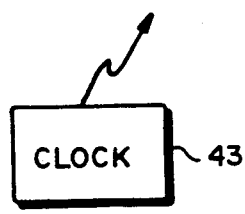
Figure 1B:
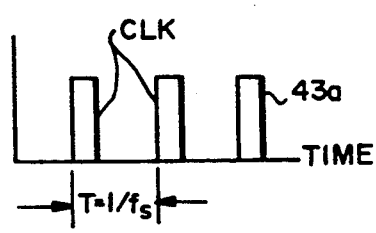
FIG. 1B is a representation of a clock signal CLK suitable for use in the digital oscillator of FIG. 1.

FIG. 1A shows a recursive digital oscillator 10 in accordance with the invention for generating sinusoidal digital sequences $x_1(n)$, $x_2(n)$ having pre-selected sinusoidal amplitudes, and frequencies, and a pre-selected relative phase relationship, e.g., phases that are nearly perfectly quadrature related.

The digital oscillator 10 has first and second multiplying-integrating modules 12, 14, which are interconnected in a closed feedback loop arrangement. Each module 12, 14 has a multiplier 16, 18 for multiplying an input signal received from the other module 14, 12 by a coefficient $\alpha$, $-\beta$ supplied, for example, by a signal generator 20A, 20B. Each module 12, 14 also has a digital integrator 22, 24 for integrating the output from the associated multiplier 16, 18 to generate the input signal for the multiplier 18, 16 of the other module 14, 12, and to generate a different one of the digital output sequences of the oscillator.

More specifically, the integrator 22 of the first module 12 is a substantially delay-free forward path ("DFFP") integrator, and integrator 24 of the second module 14 is a delay-forward-path ("DFP") integrator. As the name implies, the DFFP integrator 22 has a delay-free forward signal path 32 from an input adder 34 to an output 36. The input adder 34 forms the sum of the product from the multiplier 16 and a delayed feedback signal from a register 38; this sum is applied to a signal path 32 and is the signal at output 36, from which it is applied as the input signal to multiplier 18.

The DFFP integrator 22 has a storing device, i.e., the register 38, in a feedback path 42 between the integrator output 36 and the adder 42 for forming a delayed version of the signal at output 36. Each input to the shift register 38 is stored therein for a period "T," i.e., the period characterizing a clock signal CLK supplied by a clock 43, as illustrated in FIG. 1A. (The clock signal CLK comprises a series of pulses 43a, each separated by the period "T," which is equal to the reciprocal of the sampling frequency $f_s$.) The shift register 38 applies that delayed version as the feedback signal to the adder 34. The shift register 38 also supplies that delayed version as the signal $x_2(n)$ to an output line 44.

The DFP integrator 24, on the other hand, has a storing device, i.e., a register 50, for providing a delay in a forward path 52 from an input adder 54 to an output 56. Each input to the shift register 50 is stored therein for a period "T," i.e., the period T of the clock signal CLK. The input adder 54 forms the sum of the product from the multiplier 18 and the content of the register 50, and this sum is applied to signal path 52. The register 50 content is the signal at output 56, from which it is applied as the input signal to multiplier 16.

The DFP integrator 24 thus has a substantially delay-free feedback path 57 between the integrator output 56 and the adder 54 for applying a feedback signal to the adder 54. The integrator output 56, which is also the output from the shift register 50, is applied to output line 58 as the signal $x_1(n)$.

The DFP and DFFP integrators 24, 22 can be described mathematically in terms of the following difference equations:

$$x_1(n+1) = x_1(n) - \beta x_2(n+1) \quad (1)$$

$$x_2(n+1) = \alpha x_1(n) + x_2(n) \quad (2)$$

In other words, the output value $x_1(n+1)$ of the DFP integrator 24 during a clock pulse "n+1" (where "n" is an integer) is equal to the output value $x_1(n)$ from that integrator 24 for the immediately preceding clock pulse added to the input value, $-\beta x_2(n+1)$, from multiplier 18 during clock pulse "n+1." Moreover, the output value $x_2(n+1)$ from the DFFP integrator 22 at time "n+1" is equal to the undelayed input signal $\alpha x_1(n)$ from multiplier 16 during the immediately preceding period of time added to the output $x_2(n)$ from integrator 22 during the immediately preceding period of time.

Figure 2A:
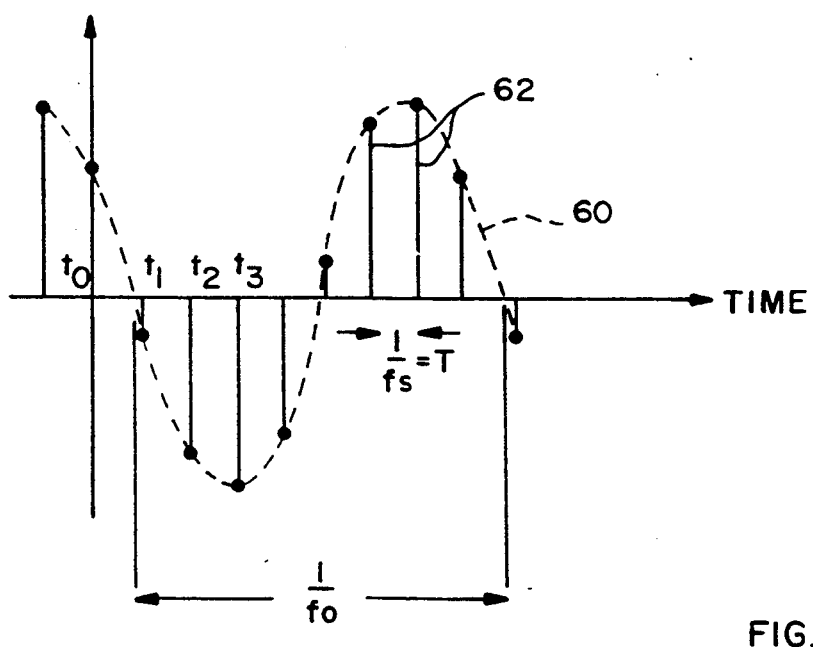
FIG. 2A is a representation of a sampled sinusoid signal or waveform generated by the digital oscillator of FIG. 1A.

As represented in FIG. 2A, each sinusoidal digital sequence $x_1(n)$, $x_2(n)$ from the two modules 12, 14 accurately represents a continuous sinusoidal waveform 60 by specifying instantaneous voltages 62 of the waveform at times $n = t_0, t_1, t_2, t_3$, etc. that are spaced from one another by period T, which, as noted above, is the period of the clock signal and equal to the inverse of the sampling frequency, $f_s$.

Mathematically, the sinusoidal digital sequences $x_1(n)$, $x_2(n)$ from the two modules 12, 14 can be expressed as Equations 3 and 4, below, when the initial conditions, i.e., the contents of the registers 38, 50 at time n=0, are, e.g., $x_1(0)=0$ and $x_2(0)=I$, where "I" is a rational number, and where the number of samples per cycle is much much larger than one (e.g., 10 or more):

$$x_1(nT) = -BI \sin(2\pi f_0 Tn) \quad (3)$$

$$x_2(nT) = AI \cos(2\pi f_0 T(n + \tfrac{1}{2})) \quad (4)$$

where $$A = (1 - \alpha\beta/4)^{-\tfrac{1}{2}} \quad (5)$$

$$B = (\alpha/\beta - \alpha^2/4)^{-\tfrac{1}{2}} \quad (6)$$

$$f_0 = 1/(2\pi T) \cos^{-1}(1 - \alpha\beta/2) \quad (7)$$

Thus, the amplitudes of the sampled sinusoidal signals are functions of the multiplier coefficients $\alpha$ and $\beta$, and the frequency, "$f_0$," of the signals is a function of both the multiplier coefficients and the clock period, T.

Moreover, regardless of the values of $f_0$, $f_s$, and the multiplier coefficients, the sampled sinusoidal sequence $x_2(n)$ is always one half of a cycle, i.e., T/2, ahead of being in perfect quadrature with the sampled sinusoidal sequence $x_1(n)$.

Figure 2B:
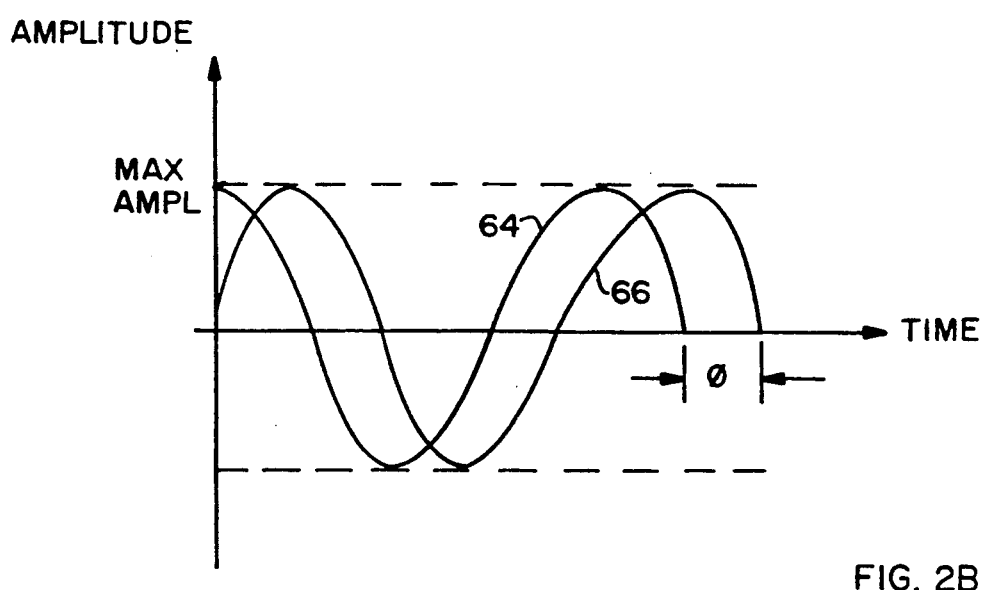
FIG. 2B is a representation of a pair of continuous sinusoidal signals or waveforms of pre-selected phase relationship.

As can be seen in FIG. 2B, the two continuous sinusoidal signals specified by $x_1(n)$ and $x_2(n)$ have a phase difference $\phi$. Because the sampling frequency is typically higher, and preferably much higher, than the frequency of the illustrated continuous sinusoidal signals, and the latter frequency is typically in the audio or even radio frequency range, T/2 is quite small, and $\phi$ is thus very nearly 90 degrees.

Furthermore, as can be seen from Equations 5 and 6, when $\alpha$ equals $\beta$, the amplitudes of the two signals are equal, and the optimal dynamic range is obtained. When other than equal values are used for the multiplier coefficients, on the other hand, sinusoidal signals of different amplitudes are obtained.

As an illustrative application for the digital oscillator of FIG. 1A, consider the generation of a supervisory audio tone for a radio-telephone. The supervisory audio tone in this example requires a frequency, $f_0$, of 6000 Hz. To generate this signal using the digital oscillator 10, a suitable value for the number of samples per cycle is, say, one hundred, which yields a sampling frequency $f_s = 600,000$ Hz and a sample period $T = 1/f_s = 1/600,000$ sec. Under these conditions, Equation 7 can be solved for $\alpha$ and $\beta$, where equal multiplier coefficients are used, to yield a value of $\alpha = \beta = 0.0628$. Thus, the digital oscillator 10 will generate sinusoidal signals at 6000 Hz when the multiplier coefficients are both 0.0628, and the clock period for the registers 38, 50 is 1/600,000 sec.

Figure 3:
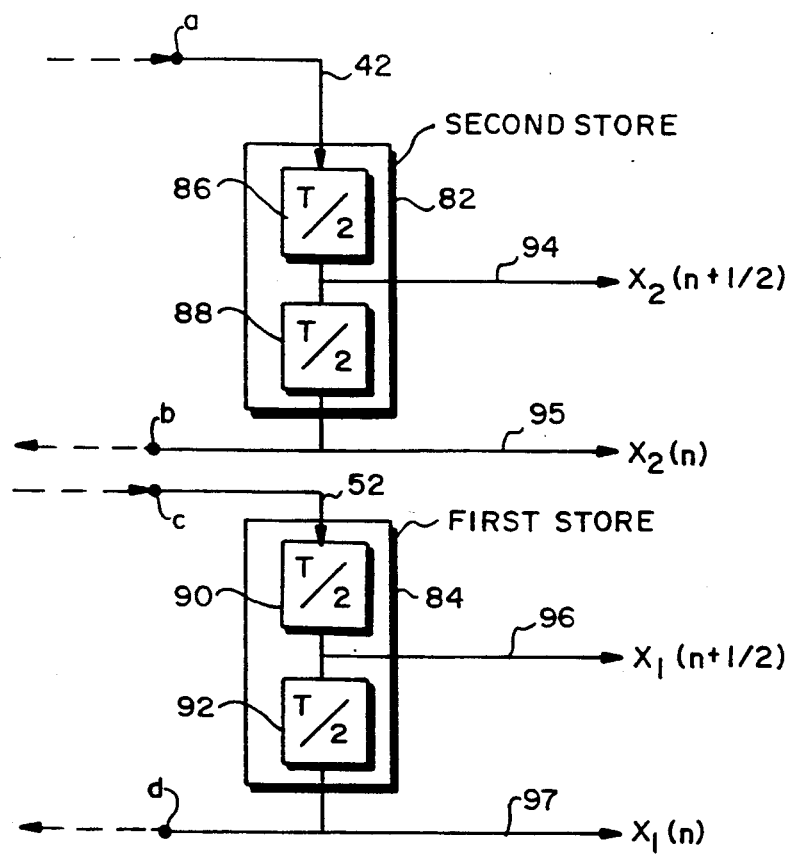
FIGS. 3 through 5 are block diagrams of various alternative delay-introducing element arrangements for use in the digital oscillator of FIG. 1A for producing pairs of perfectly-quadrature-related sampled sinusoidal signals.
Figure 4:
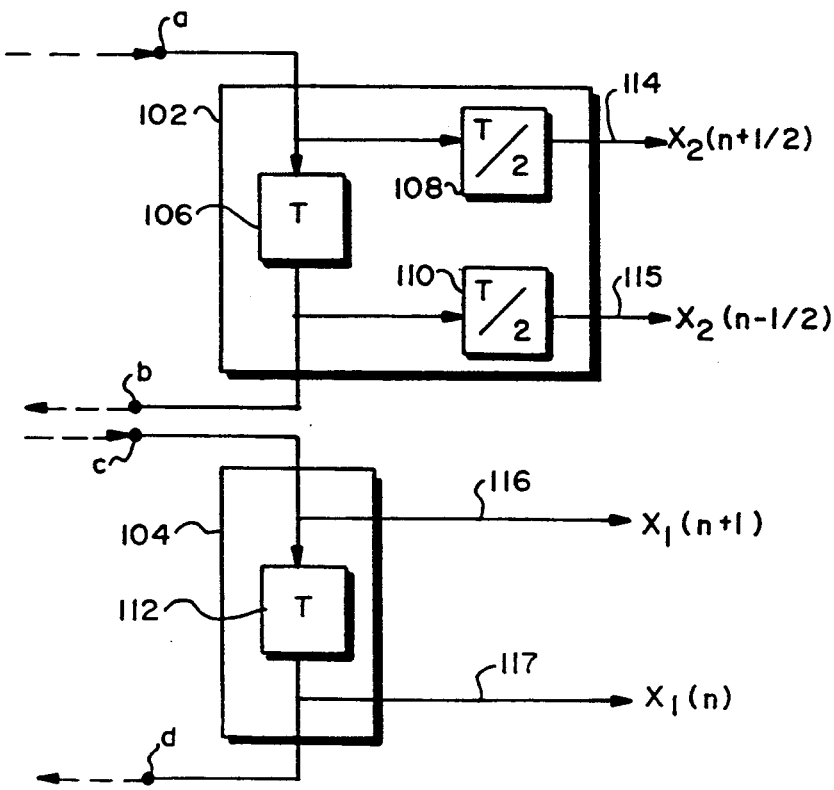
Figure 5:
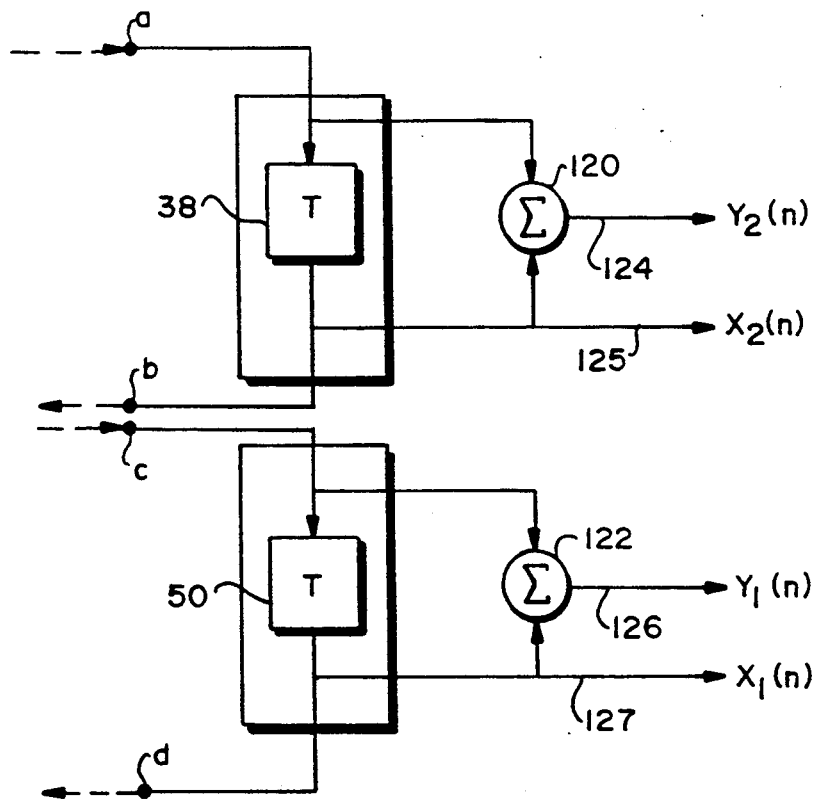

FIGS. 3 through 5 show alternative arrangements for the storing devices shown as registers 38, 50 in FIG. 1A that, in these latter embodiments, permit the digital oscillators to produce perfectly-quadrature-related sampled sinusoidal signals.

In FIG. 3, the portions of the digital oscillator 10 between nodes "a" and "b," and between nodes "c" and "d," of FIG. 1A are shown as comprising respective delay devices 82, 84, each comprising a pair of, e.g., registers 86, 88, 90, 92 disposed serially in lines 42, 52. Each shift register 86–92 furnishes a T/2 second delay. The outputs of the registers 86–92, designated $x_2(n+\tfrac{1}{2})$, $x_2(n)$, $x_1(n+\tfrac{1}{2})$, $x_1(n)$, respectively, are applied to output lines 94–97 and form two pairs of perfectly-quadrature-related sampled sinusoidal signals, $x_1(n+\tfrac{1}{2})$ and $x_2(n)$, $x_2(n+\tfrac{1}{2})$ and $x_1(n)$.

In FIG. 4, the portions of the digital oscillator 10 between nodes "a" and "b," and between nodes "c" and "d," of FIG. 1A are shown as comprising respective delay devices 102, 104. Delay device 102 comprises a register 106 serially connected in line 42 for storing an input for T seconds. The input to and output from the register 106 are fed to respective second and third registers 108, 110. Each register 108, 110 is clocked every T/2 seconds. Delay device 104 comprises a storing device, e.g., a shift registers 112 serially connected in line 52 for delaying an input for T seconds.

The outputs from registers 108, 110, designated $x_2(n+\frac{1}{2})$, $x_2(n-\frac{1}{2})$, are applied to output lines 114, 115, respectively. The input and output of register 112, designated $x_1(n+1)$, $x_1(n)$, are applied to output lines 116, 117, respectively. These outputs form two pairs of perfectly-quadrature-related sampled sinusoidal signals, $x_1(n)$ and $x_2(n-\frac{1}{2})$, $x_1(n+1)$ and $x_2(n+\frac{1}{2})$.

In FIG. 5, the portions of the digital oscillator 10 between nodes "a" and "b," and between nodes "c" and "d," of FIG. 1A are shown as comprising respective delay devices, e.g., shift registers 38, 50, as in FIG. 1A. However, unlike the embodiment shown in that drawing, the input and output of each register 38, 50 are applied as inputs to a respective adder 120, 122. The outputs of the adders 120, 122, designated $y_2(n)$, $y_1(n)$ are applied to output lines 124, 126, respectively. The outputs of registers 38, 50, designated $x_2(n)$, $x_1(n)$, are applied to output lines 125, 127, respectively. These outputs form two pairs of perfectly-quadrature-related sampled sinusoidal signals, $x_2(n)$ and $y_1(n)$, $x_1(n)$ and $y_2(n)$.

Figure 6:
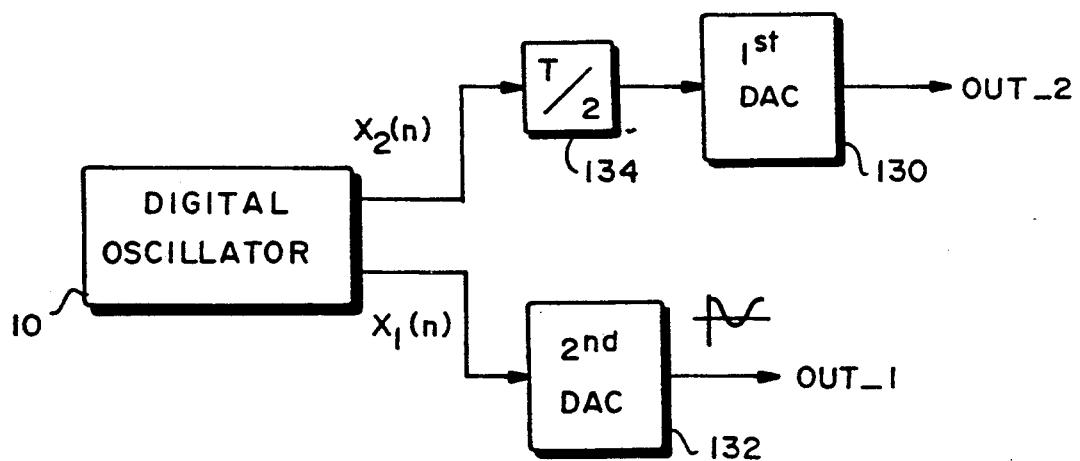
FIG. 6 is a block diagram of an arrangement for using the digital oscillator of FIG. 1A to produce a pair of perfectly-quadrature-related sampled sinusoidal signals.

Another approach for obtaining perfectly-quadrature-related sampled sinusoidal signals is shown in FIG. 6. There, the outputs $x_2(n)$, $x_1(n)$ from digital oscillator 10 are applied to respective digital-to-analog converters ("DAC's") 130, 132. DAC 130 receives its input from a delay device, i.e., a shift register 134, which provides a delay of T/2. The output OUT_2 of the register 134 is in perfect quadrature with the output OUT_1 of DAC 132.

As noted above, by choosing the multiplier coefficients to have equal magnitudes, i.e., $\alpha$ equals $\beta$, the quadrature pairs of sampled sinusoidal signals have equal amplitudes. This is particularly advantageous, for instance, in quadrature modulation and demodulation applications. The accuracy of the equality of the amplitudes is limited only by the number of digital bits used to represent the sinusoidal values.

The digital oscillators illustrated in FIGS. 1A-6 can be initialized by loading the appropriate initial states into the two registers in a way that will lead to selected initial conditions for amplitude and phase. For instance, one of the two registers in FIG. 1A can be initialized with the value "M cos(P)" and the other with "−M sin (P)," where "M" is the selected amplitude, and "P" is the selected phase, in radians.

The initialization of the digital oscillators provides phases and amplitudes of the sampled sinusoidal signals that are precisely predetermined at selected instances of time. This is particularly advantageous, for instance, in telecommunications and waveform synthesis, e.g., to synthesize a demodulator carrier that is in phase with the carrier of a received signal.

Figure 7:
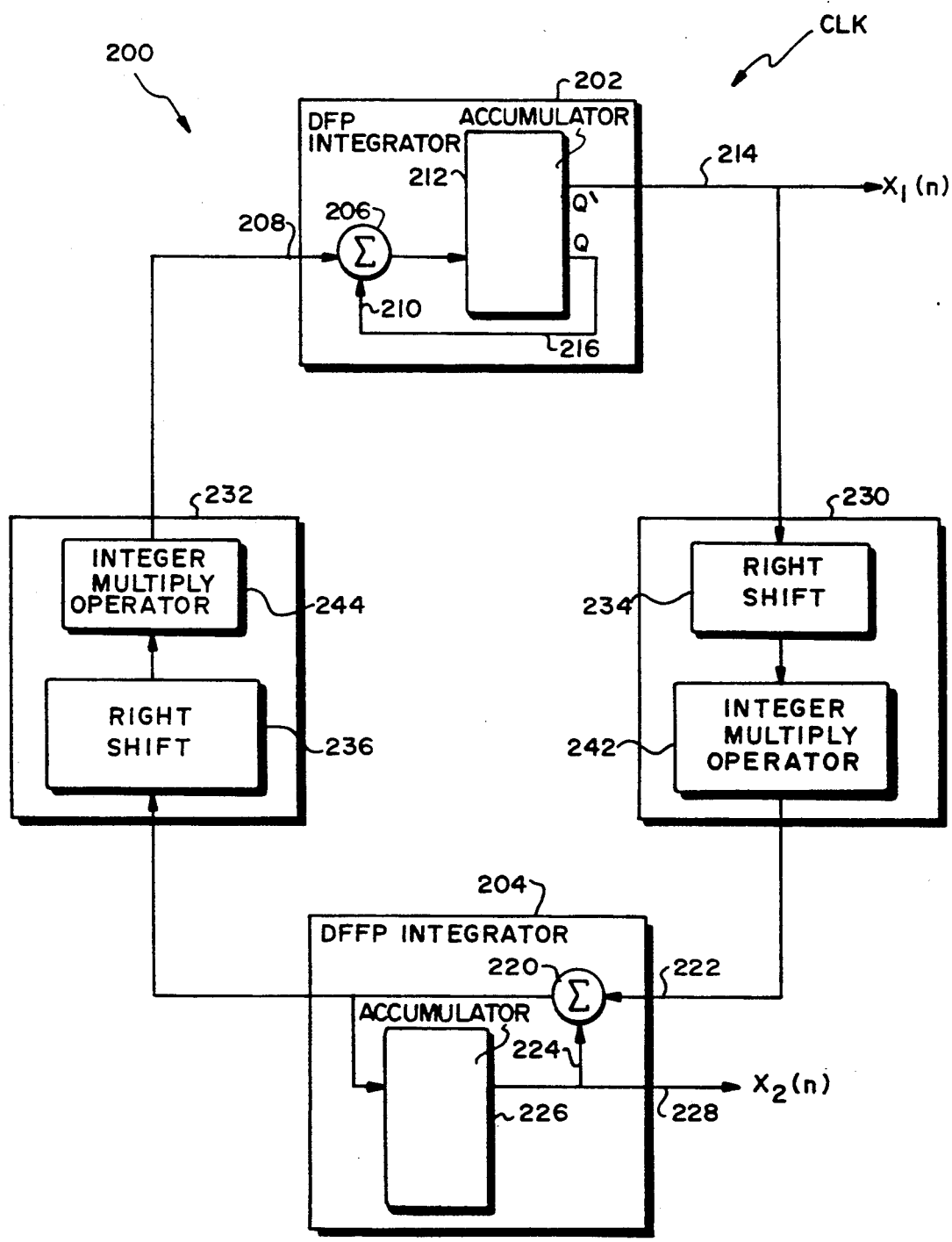
FIG. 7 is a block diagram of a "multiplierless" digital oscillator in accordance with an alternative embodiment of the invention.

FIG. 7 shows an alternative embodiment of the invention, which does not employ discrete multipliers as in the above-described versions. Instead, FIG. 7 uses certain properties of binary numbers to achieve multiplication by using right and left shift devices.

More specifically, a "multiplier-less" recursive digital oscillator 200 in accordance with the invention has a DFP integrator 202 and a DFFP integrator 204, analogous to integrators 24, 22 of FIG. 1A. The DFP integrator 202 has an adder 206 for summing signals supplied by first and second inputs 208, 210. An accumulator 212 stores the output of the adder 206 for one clock cycle, and then places the complement of its contents on an oscillator output line 214 as a first oscillator output, $x_1(n)$. The accumulator 212 also supplies its contents to a feedback line 216, which is connected to the second input 210 of the adder 206.

DFFP integrator 204 has an adder 220 for summing signals supplied by first and second inputs 222, 224. The output of the adder 220 is the output of the integrator 204. The adder output is supplied in a feedback path to the input of an accumulator 226, which stores the input for one clock cycle. The output of the accumulator 226 is supplied to the second input 224 of the adder 220, and to an oscillator output line 228 as a second oscillator output, $x_2(n)$.

Note that the DFP integrator output is taken from the output side of accumulator 212, while the DFFP integrator output is taken from the input side of accumulator 226. Because of the delays introduced by the accumulators 212, 226, the DFFP integrator output is one clock cycle ahead of the output from the DFP integrator 202.

Note also that, since a digital number is negated by forming its 2's complement (and approximately negated by reversing each bit value such that each BINARY ZERO becomes a BINARY ONE, and visa versa), the complement on line 216 represents almost exactly the negative of the accumulator contents, and the feedback signal in the DFP integrator 202 is a positive value. Forming negation this way produces an error of not more than plus or minus one (+/−1) least significant bit of the negative number, which is an insignificant error for many applications. Where the accumulator 212 is implemented as a discrete register using, e.g., conventional flip flops, the $x_1(n)$ complement is usually readily available as a flip flop output.

Oscillator 200 also has units 230, 232 for performing multiplication without requiring discrete multipliers, but rather using "binary shift and add" techniques. The units 230, 232 process the outputs of respective integrators 202, 204 in accordance with the following equations:

$$W_1 = x_1(n) \times (P_1/2^{-d_1}) \qquad (8)$$

$$W_2 = V \times (P_2/2^{-d_2}) \qquad (9)$$

Where "$W_1$" and "$W_2$" are outputs from the respective units 230, 232, "V" is the output from integrator 204, $d_1$ and $d_2$ are integer right shifters, and "$P_1$" and "$P_2$" are pre-determined integers. The units 230, 232 are preferably implemented using integrated circuits that exhibit low power-dissipation. The units 230, 232 supply the resulting products as the first inputs to the adders 220, 206 of the other integrators 204, 202.

More specifically, the units 230, 232 have respective right-shift devices 234, 236 and integer-multiply operators 242, 244. The right-shift device 234 receives the output $x_1(n)$ from line 214, and shifts the received values by $-d_1$ bit-positions, which is equivalent to dividing by $2^{d_1}$. For example, in the binary number for six, i.e., 110, a shift of one bit-position to the right (i.e., dividing by two) produces the binary number 011 or three. This can be expeditiously achieved without additional hardware in implementations where the integer-multiply operator is an integrated circuit by modifying pin assignments into the operator 242.

The integer-multiply operator 242 uses a "shift-then-add" process to multiply the right-shifted value by the integer, "$P_1$." The operator 242 performs the shift-then-add process by converting the integer into its partial products of powers of two (2), shifting the output from the right-shift device 234 by the appropriate number of positions for each term in the partial products, and supplying each of the resulting shifted quantities to the first input 222 of adder 220 of DFFP integrator 204.

An example will clarify the operation of unit 230. In order to multiply by a value $\alpha = 3/100$, first the right-shift device 234 shifts the signal $x_1(n)$ by 10 bit-positions (i.e., $d_1 = 10$), which is the same as multiplying by $x_1(n)$ by $2^{10}$ or 1024. This step yields a manageable value for the integer $P_1$ of thirty.

Then, the integer-multiply operator 242 multiplies the shifted value by thirty by first converting thirty into its partial products, as follows:

$$30 = 16 + 8 + 4 + 2 \tag{10}$$

Afterwards, the incoming number is shifted left by four positions to multiply by 16, is shifted left by three positions to multiply by 8, etc. The resulting quantities of each operation are supplied to adder 220. What this achieves is multiplication by 30/1024, which differs by only about 2% from 3/100, and thus represents an insignificant error for most applications.

The right-shift device 236 and integer-multiply operator 244 of unit 232 operate in analogous fashion, supplying the partial product intermediate results to adder 206 of DFP integrator 202. Conveniently, where $\alpha$ and $\beta$ are equal, $d_1$ and $d_2$ are equal, as are $P_1$ and $P_2$.

Accordingly, the invention can be implemented to generate near quadrature related signals without using discrete multipliers. Advantageously, the accumulators within the integrators can be used to store intermediate results of the multiplication operation, thus avoiding the need for additional hardware. Moreover, the disclosed technique produces sufficiently accurate results for a wide range of tele-communication applications.

The invention can be practiced in circuit form as described hereinabove, or, as will be apparent to those skilled in the art, as a routine in a programmable digital signal processor (not shown), in which the various registers and accumulators can be provided by memory locations.

The foregoing description has been limited to a specific embodiment of this invention. It will be apparent, however, that variations and modifications can be made to the invention with the attainment of some or all of its advantages. Therefore, it is the object of the appended claims to cover all such variations and modifications as come within the true spirit and scope of the invention.

What is claimed is:

1. A digital oscillator for generating pairs of sampled sinusoidal signals having pre-selected phase relationships, said digital oscillator comprising first and second interconnected multiplying-integrating modules, each module having a multiplier for multiplying an input signal by a first coefficient, and a digital integrator for integrating the product over a period of time and thereby generating a different one of the sampled sinusoidal signals, and generating the input signal for the multiplier of the other module.

2. The digital oscillator in accordance with claim 1, further comprising means for supplying the multiplier coefficients at values selected to obtain pre-determined amplitudes of the generated sinusoidal signals.

3. The digital oscillator in accordance with claim 2, wherein said coefficient-supplying means supplies multiplier coefficients that are substantially equal to one another, and, in response thereto, said sampled sinusoidal signals have equal amplitudes.

4. The digital oscillator in accordance with claim 1, wherein said first module has a delay-free-forward-path ("DFFP") integrator, and the second module has a delay-forward-path ("DFP") integrator.

5. The digital oscillator in accordance with claim 4, wherein said DFFP integrator has a forward path from an integrator input to an integrator output that is substantially delay-free, and a device for providing a delay in a feedback path between the integrator input and output; and said DFP integrator has a device for providing a delay in a forward path between an integrator input and an integrator output, and a feedback path between said integrator input and output that is substantially delay-free.

6. The digital oscillator in accordance with claim 4, wherein the output of the integrator of each module is applied to the other module as the multiplier input signal in a closed-loop, feedback arrangement.

7. The digital oscillator in accordance with claim 5, wherein each said delay-providing device comprises at least one shift register.

8. The digital oscillator in accordance with claim 4, further comprising digital-to-analog converter means for converting said sampled sinusoidal signals into continuous sinusoidal signals.

9. The digital oscillator in accordance with claim 5, wherein the outputs of the delay-providing devices comprise said sampled sinusoidal signals, and are applied to output lines.

10. The digital oscillator in accordance with claim 9, wherein said sampled sinusoidal signals from said delay-introducing devices are about "T/2" seconds from being in perfect quadrature, where "T" is the time in seconds of the delays introduced by said delay devices.

11. The digital oscillator in accordance with claim 10, further comprising means for introducing a delay of about T/2 into the leading sampled sinusoidal signal, thereby providing first and second quadrature-related signals.

12. The digital oscillator in accordance with claim 1, further comprising means for modulating the frequency of the sampled sinusoidal signals by varying said multiplier coefficients.

13. The digital oscillator in accordance with claim 1, further comprising means for modulating the amplitudes of the sampled sinusoidal signals by varying said multiplier coefficients.

14. The digital oscillator in accordance with claim 1, further comprising means for modulating the phases of the sampled sinusoidal signals by varying said multiplier coefficients.

15. The digital oscillator in accordance with claim 1 comprising a digital signal processor.

16. A digital oscillator for generating a first sinusoidal digital sequence, said digital oscillator comprising:
   A) first multiplier-integrator module including
      (i) means for multiplying a first multiplier input signal by a first multiplier coefficient to generate a first product, and
      (ii) means for integrating said first product to generate a first module output, and
   B) second multiplier-integrator module including (i) means for multiplying a second multiplier input signal by a second multiplier coefficient to generate a second product, and (ii) means for integrating said second product to generate a second module output, and C) wherein (i) said first module output is applied to said second multiplier-integrator module as said second multiplier input signal, (ii) said second module output is applied to said first multiplier-integrator module as said first multiplier input signal, and (iii) one of said first and second modules generates the first sinusoidal digital sequence.

17. The digital oscillator in accordance with claim 16, wherein the other of said first and second modules generates a second sinusoidal digital sequence at a pre-selected phase relationship to said first sinusoidal digital sequence.

18. The digital oscillator in accordance with claim 17, wherein said first and second modules comprise shift registers for shifting out contents stored therein in response to a clock signal.

19. The digital oscillator in accordance with claim 17, wherein

A) said first integrating means comprises:
(i) first adder means for adding said first product and a first feedback signal to generate a first sum, said first sum being said first module output, and
(ii) first shift register means coupled to said first adder means for storing said first sum as first contents for a preselected period of time, and thereafter providing said first contents to said first adder means as said first feedback signal, said first contents from said first shift register means being said first sinusoidal digital sequence, and B) said second integrating means comprises:
(i) second adder means for adding said second product and a second feedback signal to generate a second sum, and
(ii) second shift register means coupled to said second adder means for storing said second sum as second contents for a preselected period of time, and thereafter providing said second contents to said second adder means as said second feedback signal, said second contents from said second shift register means being said second sinusoidal digital sequence.

20. The digital oscillator in accordance with claim 17, wherein said first and second multiplier coefficients are approximately equal, and said first and second sinusoidal digital sequences have approximately equal amplitudes.

21. The digital oscillator in accordance with claim 17, wherein said first and second multiplying means generate said first and second products using multiple additions.

22. The digital oscillator in accordance with claim 19, wherein said multiplying means comprise first and second right-shift devices coupled to receive said respective first and second multiplier input signals, and first and second integer-multiply operators coupled to said right-shift devices for generating a plurality of quantities for forming said respective first and second products within said integrating means.

23. In a digital oscillator for generating pairs of sampled sinusoidal signals having pre-selected phase relationships, said digital oscillator comprising first and second interconnected multiplying-integrating modules, a method of generating quadrature-related signals comprising the steps of in each module, multiplying an input signal by a first coefficient, and integrating the product over a period of time and thereby generating a different one of the sampled sinusoidal signals, and generating the input signal for the multiplying step performed in the other module.

24. The method in accordance with claim 23, wherein said multiplying steps each comprise the steps of shifting the bit-positions of the output of the other module, and then performing a shift-then-add operation to perform the multiplication.

25. The method in accordance with claim 24, wherein said multiplying steps comprise the processing of the respective input signals in accordance with the following equations:

$$W_1 = x_1(n) \times (P_1/2^{-d_1})$$

$$W_2 = V \times (P_2/2^{-d_2})$$

where "$W_1$" and "$W_1$" are the results from the multiplying steps, $x_1(n)$ and $V$ are the results from the integrating steps which are the input signal for the multiplying steps performed in the other modules, and "$P_1$" and "$P_2$" are pre-determined integers, respectively.

26. The method in accordance with claim 25, wherein each said multiplying step comprises receiving the output $x_1(n)$, $V$, and right-shifting the received values by a pre-selected number of bit-positions, and multipling the right-shifted value by the associated integer.

27. The method in accordance with claim 26, wherein each said integer-multiplying step comprises the steps of converting the associated integer into partial products of powers of two (2), shifting the output from the right-shift step by the appropriate number of positions for each term in the partial products to generate thereby a plurality of shifted quantities, supplying the shifted quantities for integration in the other module.

* * * * *